United States Patent [19]
Wada et al.

[11] Patent Number: 5,764,092
[45] Date of Patent: Jun. 9, 1998

[54] DELAY CLOCK GENERATOR FOR GENERATING A PLURALITY OF DELAY CLOCKS DELAYING THE BASIC CLOCK

[75] Inventors: Koji Wada; Minoru Akiyama, both of Tokyo, Japan

[73] Assignee: NEC, Tokyo, Japan

[21] Appl. No.: 650,635

[22] Filed: May 20, 1996

[30] Foreign Application Priority Data

May 26, 1995  [JP]  Japan ................... 7-128051

[51] Int. Cl.$^6$ ................................ H03H 11/26
[52] U.S. Cl. ................ 327/271; 327/149; 327/151; 327/152; 327/153; 327/234; 327/295
[58] Field of Search ................ 327/147, 149, 327/151–3, 234, 295, 271

[56]  References Cited

U.S. PATENT DOCUMENTS

| | | | |
|---|---|---|---|
| 5,481,573 | 1/1996 | Jacobowitz et al. | 327/153 |
| 5,570,054 | 10/1996 | Takla | 327/295 |
| 5,633,608 | 5/1997 | Danger | 327/152 |

FOREIGN PATENT DOCUMENTS 3-86365  8/1991  Japan .

*Primary Examiner*—Margaret Rose Wambach
*Attorney, Agent, or Firm*—Laff Whitesel Conte & Saret Ltd.

[57]  ABSTRACT

The present invention provides a delay clock generator where a plurality of stable delay clocks can be generated and digitizing is easy. The delay clock generator comprises first to nth (n: integer not less than 2) delay circuits (11 to 1n) connected in cascade connection for delaying the basic clock (KO) in sequence, a phase comparator (21) for comparing phase of a delay clock from the nth delay circuit (1n) with that of the basic clock, and a delay control circuit (31) for generating a delay control value to make the phase of the delay clock from the nth delay circuit synchronize with that of the basic clock based on a phase comparison result, and for controlling delay amounts of the first to nth delay circuits respectively by the delay control value. In the present invention, a voltage control type oscillator is not used, and since delay amounts of the first to nth delay circuits are controlled by the delay control value generated based on the phase comparison result, the delay clock generator can be constituted wholly by digital circuits and moreover can generate stable delay clocks.

3 Claims, 9 Drawing Sheets

COUNT UP →

|  |  | | | | | | | | | | | | |
|---|---|---|---|---|---|---|---|---|---|---|---|---|---|
| 1ST COUNT VALUE | 1 | 0 | 0 | 0 | 0 | 0 | 0 | 0 | 0 | 1 | 1 | 1 | 1 |
|  | 2 | 0 | 0 | 0 | 0 | 1 | 1 | 1 | 1 | 1 | 1 | 1 | 1 |
|  | 3 | 0 | 1 | 1 | 1 | 1 | 1 | 1 | 1 | 1 | 1 | 1 | 1 |
| 2ND COUNT VALUE | 1 | 0 | 0 | 0 | 0 | 0 | 0 | 0 | 0 | 0 | 1 | 1 | 1 |
|  | 2 | 0 | 0 | 0 | 0 | 0 | 0 | 1 | 1 | 1 | 1 | 1 | 1 |
|  | 3 | 0 | 0 | 1 | 1 | 1 | 1 | 1 | 1 | 1 | 1 | 1 | 1 |
| 3RD COUNT VALUE | 1 | 0 | 0 | 0 | 0 | 0 | 0 | 0 | 0 | 0 | 0 | 1 | 1 |
|  | 2 | 0 | 0 | 0 | 0 | 0 | 0 | 0 | 1 | 1 | 1 | 1 | 1 |
|  | 3 | 0 | 0 | 0 | 1 | 1 | 1 | 1 | 1 | 1 | 1 | 1 | 1 |
| 4TH COUNT VALUE | 1 | 0 | 0 | 0 | 0 | 0 | 0 | 0 | 0 | 0 | 0 | 0 | 1 |
|  | 2 | 0 | 0 | 0 | 0 | 0 | 0 | 0 | 1 | 1 | 1 | 1 | 1 |
|  | 3 | 0 | 0 | 0 | 0 | 1 | 1 | 1 | 1 | 1 | 1 | 1 | 1 |

← COUNT DOWN

*FIG. 9*

DELAY CLOCK GENERATOR FOR GENERATING A PLURALITY OF DELAY CLOCKS DELAYING THE BASIC CLOCK

BACKGROUND OF THE INVENTION

1. Field of the Invention

The present invention relates to a clock generator for generating a plurality of delay clocks delaying the basic clock, and more particularly to a clock generator for generating a plurality of delay clocks having the same clock period as that of the basic clock and delayed uniformly during one period of the basic clock.

2. Description of the Prior Art

In the prior art, in a data processor or an image reader, a plurality of delay signals delaying the basic clock are utilized much as timing signals for data processing or image reading. The plurality of timing signals are delay clocks having the same clock period as that of the basic clock and generated by delaying the basic clock in sequence in the definite delay time. The delay clocks are actually selected among a plurality of delay clock signals in matching with timing of the data processing and image reading. A delay clock generator for generating a plurality of delay clocks is constituted in that D1 to Dn (n:integer) having the definite delay value are connected in series as shown in FIG. 1. If the basic clock CKin is supplied to the delay circuit D1 in the initial stage, the delay circuits D1 to Dn delay the basic clock CKin in sequence and output the delay clocks CK1 to CKn. Here, if the period of the basic clock CKin is made T, the delay time of each delay circuit is expressed by T/n. Consequently, the delay clock generator in FIG. 1 generates the n delay clocks CK1 to CKn delayed uniformly during the period T of the basic clock CKin.

Another delay clock generator is disclosed in Japanese Patent Utility Model Laid-Open No. Hei 3-86365 published on Aug. 30, 1991. The delay clock generator as shown in FIG. 2 comprises a PLL circuit 100 for generating a high speed clock CKx synchronized with the basic clock CK0 and having frequency higher than that of the basic clock CK0, and a plurality of flip-flop circuits F1 to Fn for shifting the basic clock CK0 by a definite time in sequence in synchronization with the high speed clock CKx and generating a plurality of delay clocks.

The PLL circuit 100 comprises a phase comparator 101, a low-pass filter 102, a voltage control type oscillator 103 and a counter 104. The voltage control type oscillator 103 generates the high speed clock CKx. The counter 104 counts the high speed clock CKx from the voltage control type oscillator 103 thereby generates a clock signal having the same period as that of the basic clock CK0. The phase comparator 101 compares phase of the basic clock CK0 with that of the clock from the counter 104, and outputs a phase detection signal representing whether the phase of the clock from the counter 104 leads or lags from that of the basic clock CK0. The phase detection signal is converted into voltage in the low-pass filter 102. In response to the voltage, the voltage control type oscillator 103 adjusts the generating timing of the high speed clock CKx so that phases of the clocks in the phase comparator 101 are coincident. The flip-flop circuits F1 to Fn shift the basic clock CK0 in sequence by the high speed clock CKx from the voltage control type oscillator 103.

However, in the delay clock generator in FIG. 1, each delay circuit cannot obtain definite delay due to disturbance of the temperature variation and the voltage variation, and it is difficult to always generate the stable delay clock.

Also in the delay clock generator in FIG. 2, although influence of the disturbance is eliminated by using the PLL circuit and the stable delay clock is always generated, since the voltage control type oscillator is used, it is difficult to constitute such a delay clock generator by digital circuits only, and also since the power sources in two systems are required, the cost cannot be suppressed.

SUMMARY OF THE INVENTION

An object of the present invention is to provide delay clock generator where a plurality of stable delay clocks can be generated and digitizing is easy.

A delay clock generator obtained according to the present invention comprises first to nth (n: integer not less than 2) connected in cascade connection for delaying the basic clock in sequence, a phase comparator for comparing phase of a delay clock from the nth delay circuit with that of the basic clock, and a delay control circuit for generating a delay control value to make the phase of the delay clock from the nth delay circuit synchronize with that of the basic clock based on the phase comparison result, and for controlling delay amounts of the first to nth delay circuits respectively by the delay control value.

In the present invention, since a voltage control type oscillator is not used and delay amounts of the first to nth delay circuits are controlled by the delay control value generated based on the phase comparison result, the delay clock generator can be wholly constituted by digital circuits and moreover stable delay clocks can be generated. The first to nth delay circuits are variable delay circuits where a delay time is varied in response to a delay control value from the delay control circuit. The variable delay circuit specifically has a plurality of delay elements connected in series, and the series connection number of the delay elements is varied by the delay control value thereby the delay time is varied.

In the present invention, the phase comparator compares the phase of the delay clock from the nth delay circuit with that of the basic clock, and outputs a phase comparison result in binary signals representing whether the phase of the delay clock from the nth delay circuit leads or lags from that of the basic clock. When the phase of the delay clock from the nth delay circuit leads from that of the basic clock, the delay control circuit generates a delay control value so that delay amounts of the first to nth delay circuits become larger in sequence. On the contrary, when the phase of the delay clock from the nth delay circuit lags from that of the basic clock, the delay control circuit generates a delay control value so that delay amounts of the first to nth delay circuits become smaller in sequence. Thereby the delay clock from the nth delay circuit is controlled so that the phase of the delay clock is synchronized with that of the basic clock thereby the phase is stabilized. Thus in the present invention, delay amounts of the first to nth delay circuits are varied in sequence in each basic clock, thereby nearly uniform delay amount in each delay circuit is set during the period T of the basic clock.

BRIEF DESCRIPTION OF THE DRAWINGS

FIG. 9 is a table showing count values in a counter circuit of the delay control circuit in FIG. 6.

DETAILED DESCRIPTION OF THE PREFERRED EMBODIMENT

Figure 1:
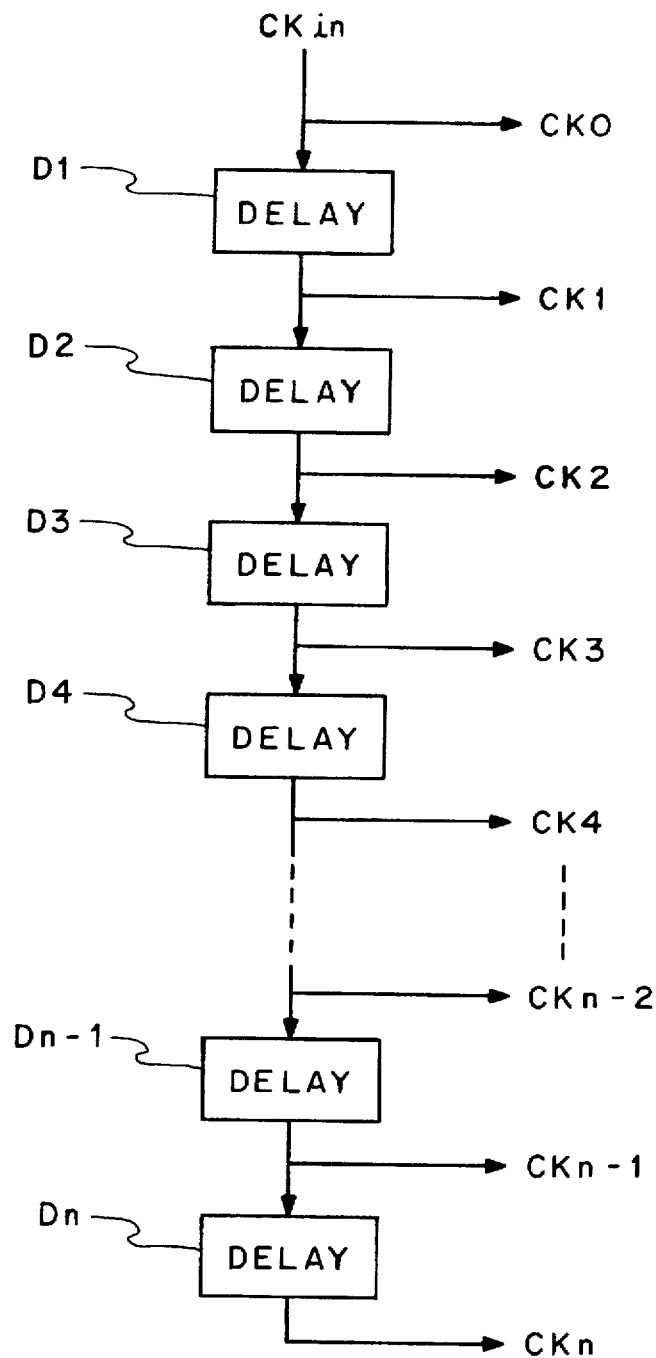
FIG. 1 is a circuit diagram showing a delay clock generator in the prior art.
Figure 2:
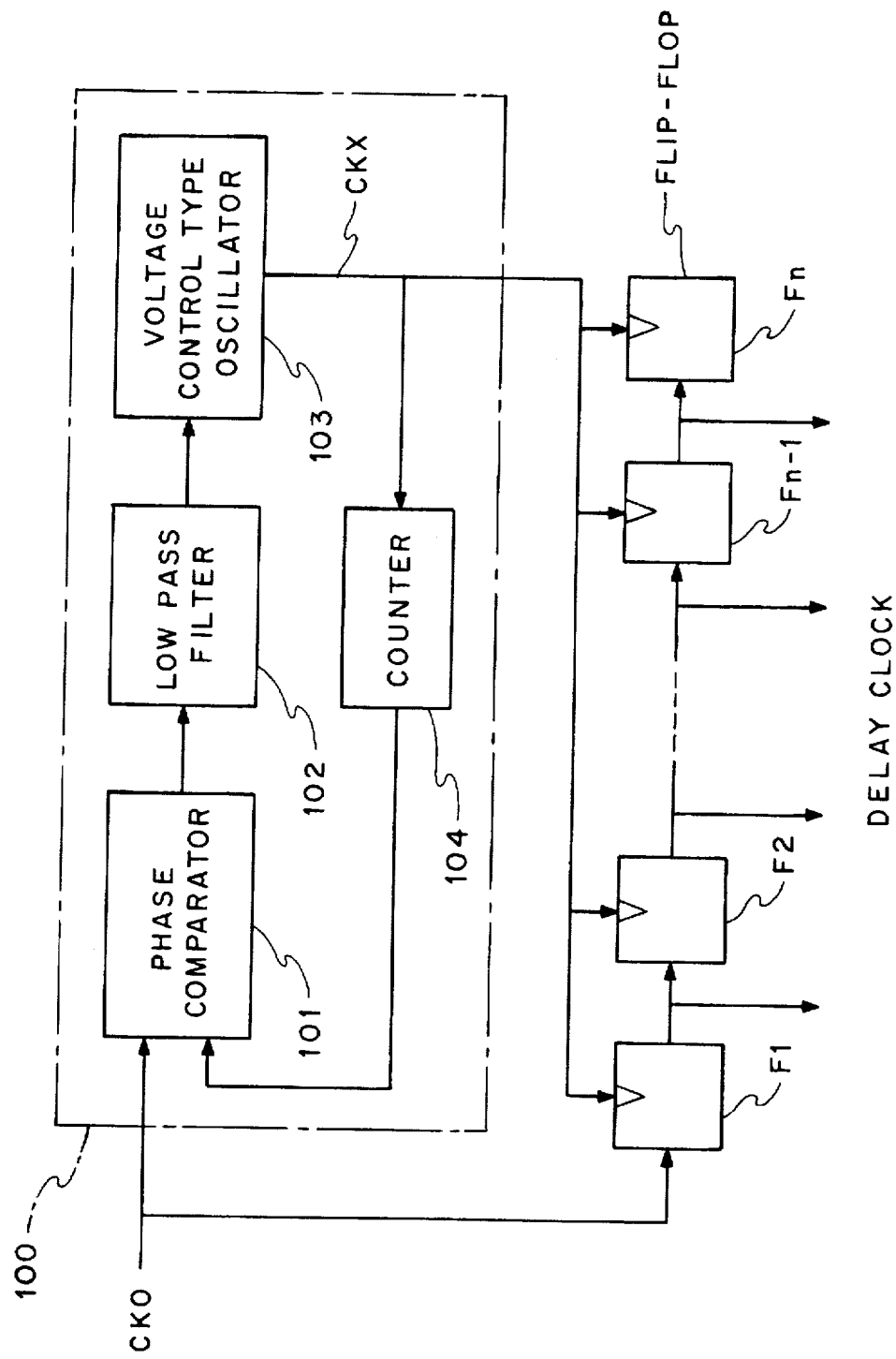
FIG. 2 is a circuit diagram showing another delay clock generator in the prior art.
Figure 3:
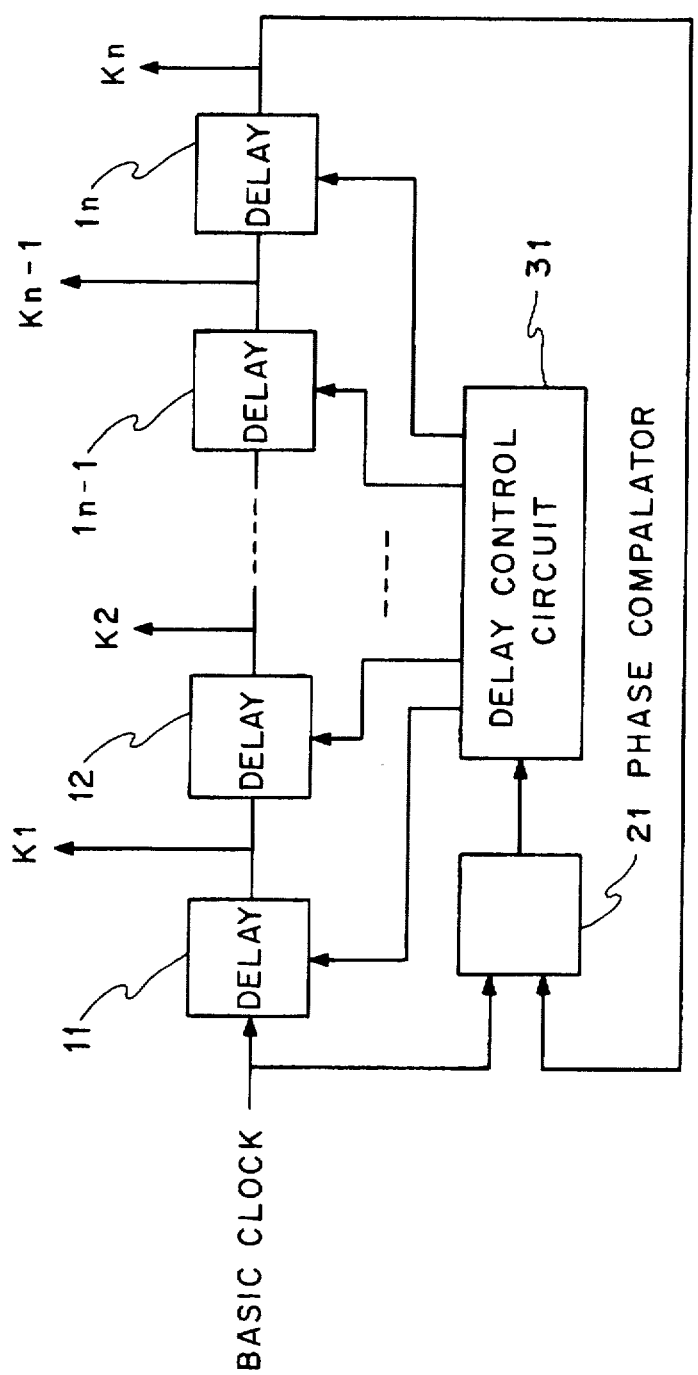
FIG. 3 is a block diagram showing a delay clock generator according to an embodiment of the invention.

In FIG. 3, a delay clock generator in an embodiment of the present invention comprises first to nth delay circuits 11 to 1n connected in series, a phase comparator 21 and a delay control circuit 31. The delay circuits 11 to 1n delay the basic clock K0 in sequence and output delay clocks K1 to Kn. The delay circuits 11 to 1n respectively have the same circuit configuration. A delay time (delay amount) of each delay circuit is determined by a delay control value outputted from the delay control circuit 31 and expressed in a digital value.

The phase comparator 21 compares phase of the delay clock Kn from the nth delay circuit in with that of the basic K0, and outputs a phase comparison result in binary signals which represents whether the phase of the delay clock Kn leads or lags from that of the basic clock K0.

When the phase of the delay clock Kn leads from that of the basic clock K0, the delay control circuit 31 supplies the first to nth delay control values to the delay circuits 11 to 1n so that delay time values of the delay circuits 11 to 1n become larger in sequence. Also when the phase of the delay clock Kn lags from that of the basic clock K0, the delay control circuit 31 supplies the first to nth delay control values to the delay circuits 11 to 1n so that delay time values of the delay circuits 11 to 1n become smaller in sequence. Thereby the delay clock Kn is controlled so that the phase of the delay clock Kn is synchronized with that of the basic clock K0, and the delay time of each delay circuit becomes uniform.

Figure 4:
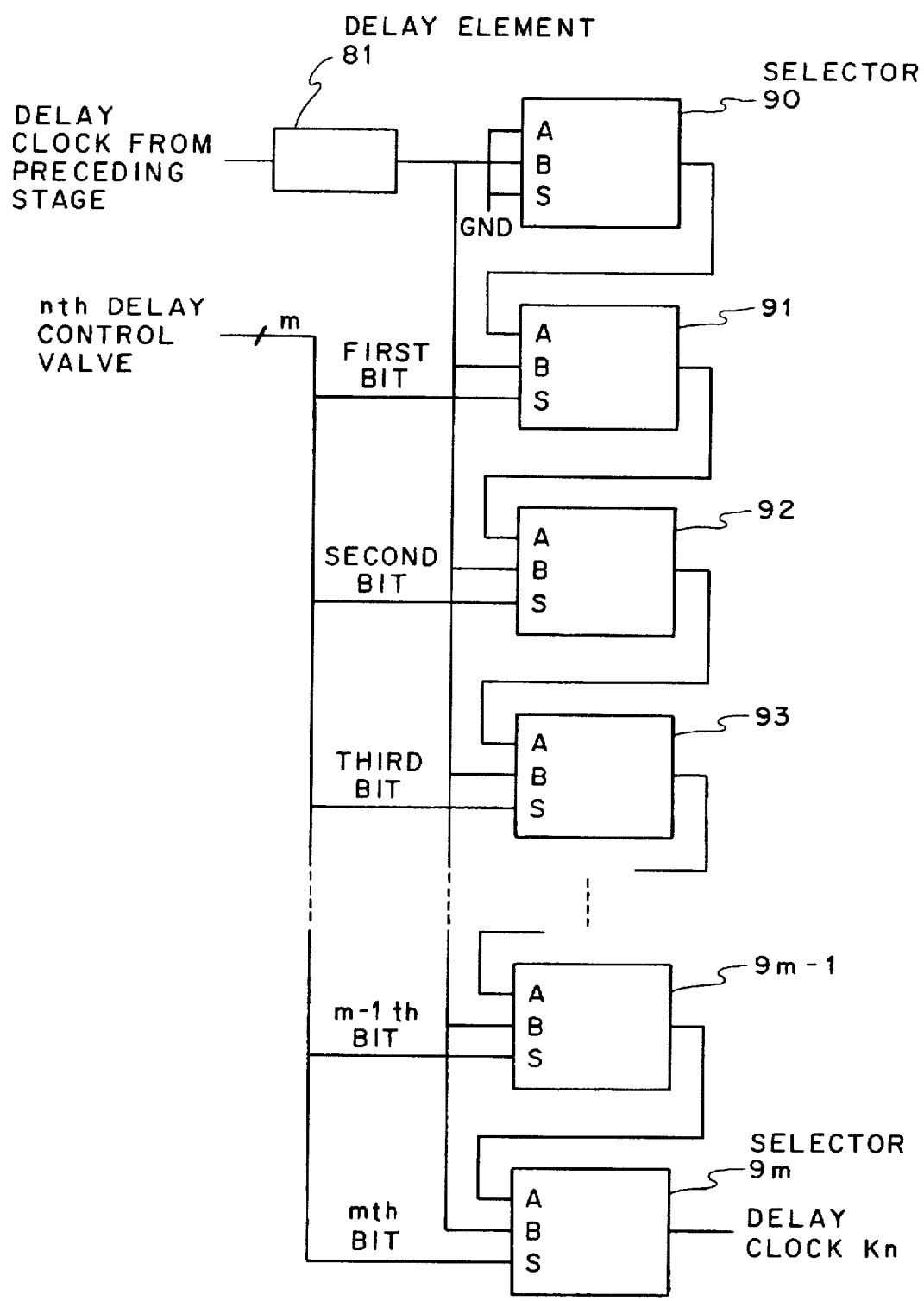
FIG. 4 is a detailed circuit diagram of a delay circuit of the delay clock generator in FIG. 3.
Figure 7:
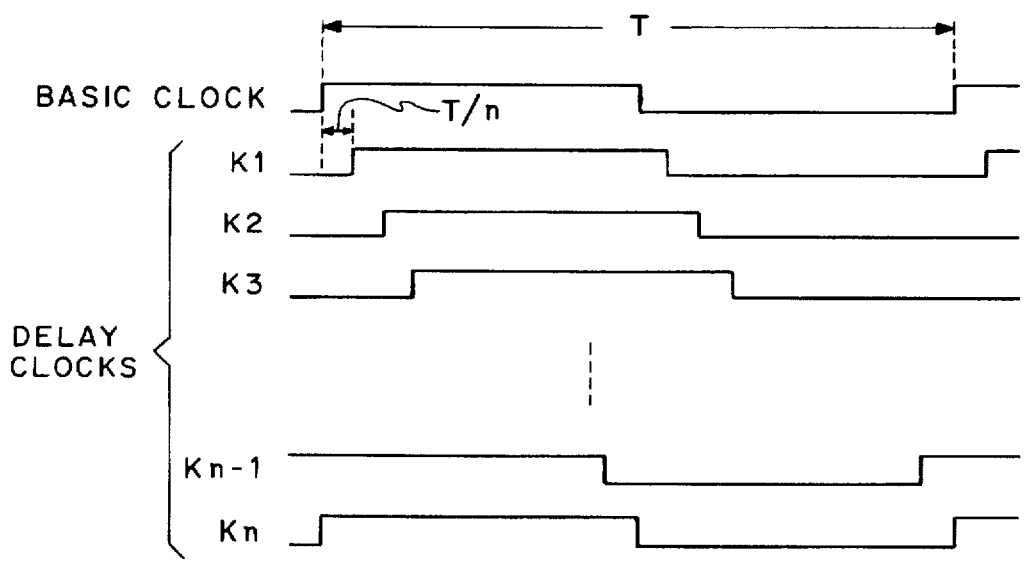
FIG. 7 is a timing chart showing delay clocks from delay circuits of the delay clock generator in FIG. 3.

Regarding control of delay time values of the delay circuits 11 to 1n, the delay control circuit 31 does not vary the delay time largely in one delay circuit only, but varies the delay amount little by little in sequence from the first delay circuit to the nth delay circuit or from the nth delay circuit to the first delay circuit in each basic clock. Thereby as shown in FIG. 7, nearly uniform delay is given to the delay clocks K1 to Kn. That is, the delay amount of 1/n of the basic clock period T is set to each delay circuit. Next, each circuit element of the delay clock generator in FIG. 3 will be described in detail. FIG. 4 is a detailed circuit diagram of the nth delay circuit 1n. Also the first to (n−1)th delay circuits 11 to 1n−1 respectively have the same circuit configuration as that of FIG. 4.

In FIG. 4, the nth delay circuit 1n has selectors 90 to 9m each delaying a delay clock from the delay circuit in the preceding stage in response to the nth delay control value from the delay control circuit 31. The delay clock Kn is outputted from the selector 9m in the final stage. The nth delay control value is a digital signal of m bits, and the first to mth bits are supplied in parallel to the selection control terminals S of the selectors 91 to 9m. The delay elements 81 is a delay circuit for the timing adjustment. The delay element 81 delays the delay clock from the preceding stage so that the delay clock from the delay circuit in the preceding stage is supplied stably to the terminals B of the selectors 90 to 9m at the timing that the nth delay control value from the delay control circuit 31 in FIG. 3 is supplied to the selectors 90 to 9m.

Each terminal A of the selectors 91 to 9m is supplied with output of the selector in the preceding stage. When each selection control terminal S of the selectors 90 to 9m is at the high level "1", the terminal A is selected. Also when each selection control terminal S of the selectors 90 to 9m is at the low level "0", the terminal B (output of the delay element 81) is selected. Only the selector 90 always selects output of the delay element 81. Consequently, when all delay control values of m bits are at "1", the selectors 91 to 9m select the input A, and when all delay control values of m bits are at "0", the selectors 91 to 9m select the input B. Here, if for the terminal A to be selected is called validity of the selector and for the terminal B to be selected is called invalidity of the selector, when only the selector 9m is valid, the delay amount of the delay circuit 1n becomes minimum, and when all selectors 91 to 9m are valid, the delay amount becomes maximum.

According to the above-mentioned configuration, each of the delay circuits 11 to 1n supplies delay to the delay clock from the delay circuit in the preceding stage, by the number of selectors (the number of selectors supplied with the delay value "1") selected and validated in response to the delay control value of m bits. As a result, the delay clocks K1 to Kn as shown in FIG. 7 are generated.

In FIG. 4, the delay time t of one selector is preferably expressed by $t=T/(n \times m)$ when the selector using number is the same in the first to nth delay circuits. Where m represents the selector connection number in one delay circuit (bit number of the delay control value), n represents the total number of delay circuits, and T represents the period of the basic clock.

Figure 5:
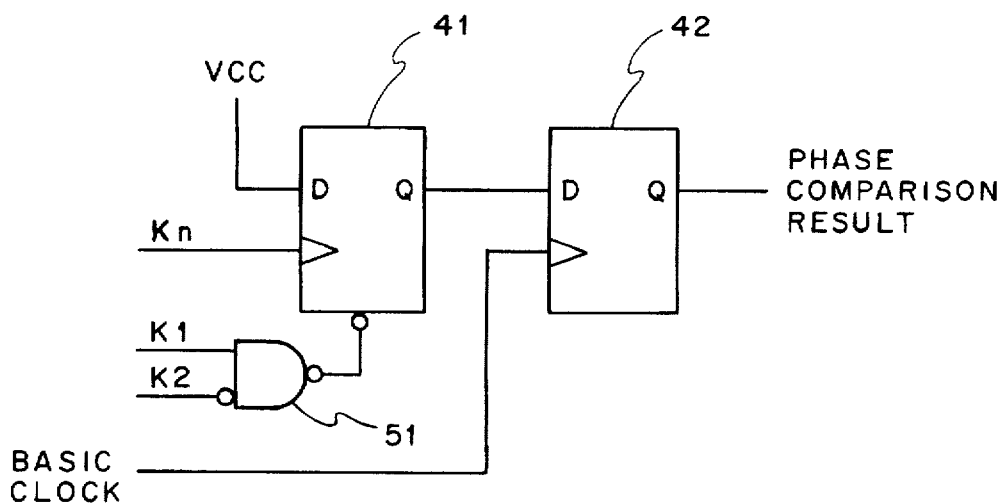
FIG. 5 is a detailed circuit diagram of a phase comparator of the delay clock generator in FIG. 3.
Figure 8A:
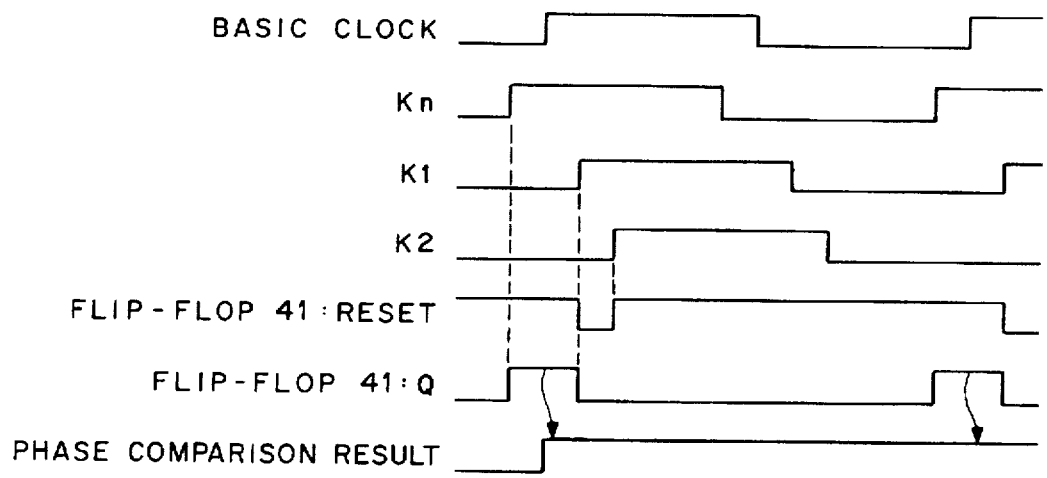
FIGS. 8A and 8B are timing charts showing operation of the phase comparator in FIG. 5.
Figure 8B:
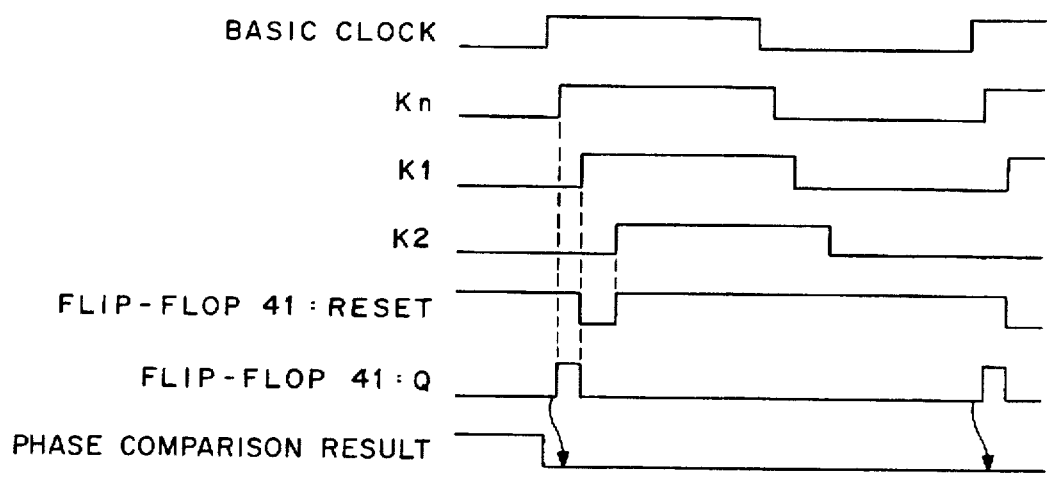

FIG. 5 is a detailed circuit diagram of the phase comparator 21, and FIGS. 8A and 8B are timing charts showing operation of the phase comparator 21. In these figures, the flip-flop 41 is set by the delay clock Kn from the nth delay circuit 1n in FIG. 3 and reset by the rise of the delay clock K1, thereby signals of high level are outputted from the rise of the delay clock Kn to the rise of the delay clock K1. The timing of the reset is formed by the gate circuit 51 inputting the delay clocks K1 and K2. The flip-flop 42 samples the output Q of the flip-flop 41 by the basic clock K0, and outputs the sampled signal as a phase comparison result. Consequently, when the phase of the delay clock Kn leads from that of the basic clock as shown in FIG. 8A, the phase comparison result becomes high level.

Also when the phase of the delay clock Kn lags from that of the basic clock as shown in FIG. 8B, the phase comparison result becomes low level.

Figure 6:
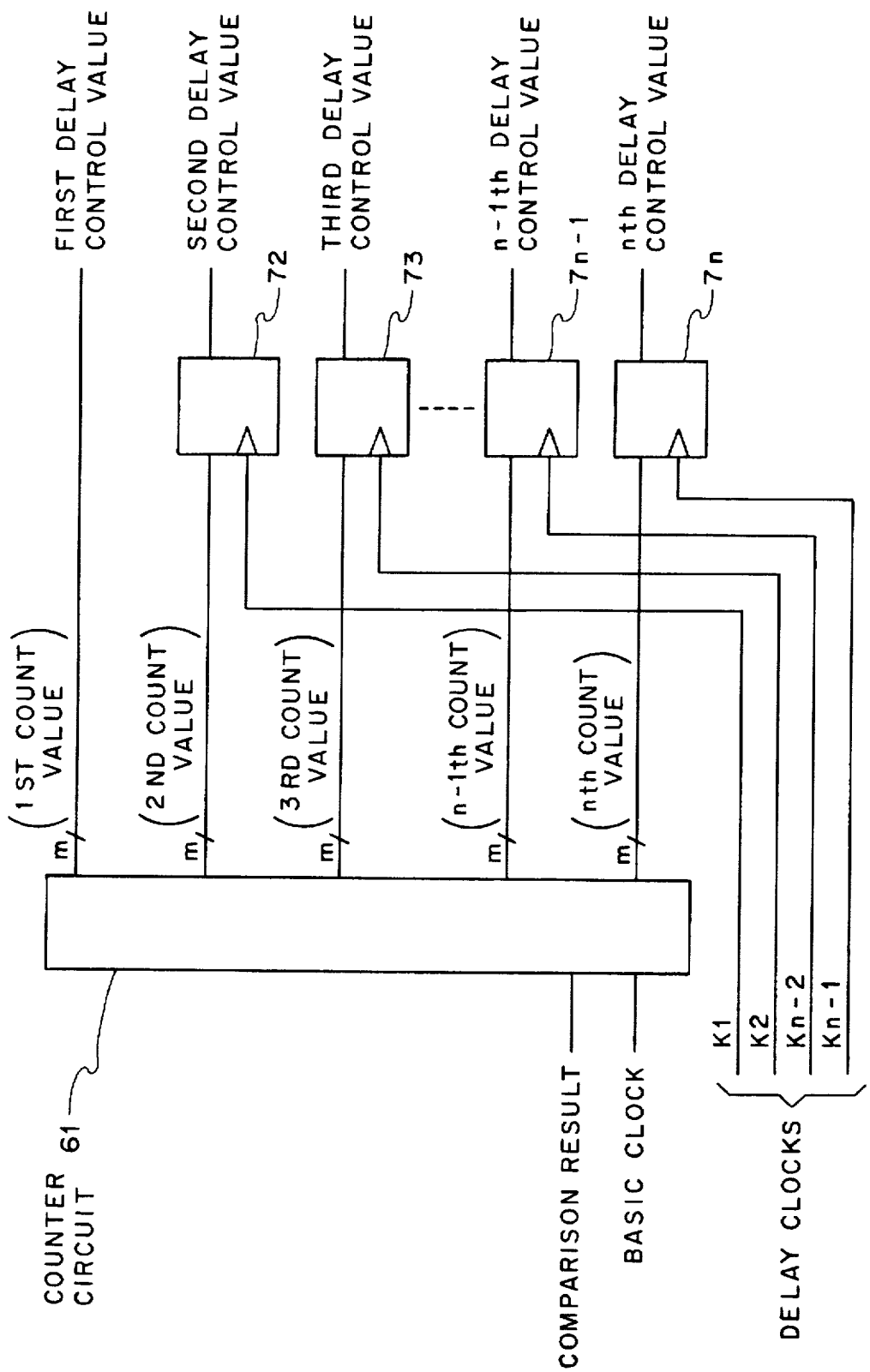
FIG. 6 is a detailed circuit diagram of a delay control circuit of the delay clock generator in FIG. 3.

FIG. 6 is a detailed circuit diagram of the delay control circuit 31. A counter circuit 61 counts the basic clock K0. When the phase comparison result from the phase comparator 21 is high level (phase lead), the counter circuit 61 executes the up count, and when the phase comparison result from the phase comparator 21 is low level (phase lag), the counter circuit 61 executes the down count. That is, in each phase comparison, the count value is varied by one. Also the counter circuit 61 simultaneously generates count values from the first count value of m bits to the nth count value of m bits, and these values become the first to nth delay control values. FIG. 9 is a table showing variation of count values in the counter circuit 61 when the bit number m of each delay control value is 3 and the number n of delay circuit is 4.

When the phase leading state continues, in the counter circuit 61, the first to nth count values count up in sequence every time the phase lead is detected. First, the first count value counts up by one, and next the second count value counts up by one. The second count value counts up by one, and then the third count value counts up by one. Such operation continues as long as the phase comparison result is at the high level state, and if the nth count value counts up by one and the phase comparison result is still at high level, the operation is repeated again from the state that the first count value counts up by one. Each count value counts up by one so that the selectors of the delay circuit in FIG. 4 become valid in sequence from the selector 9m to the selector 91. The delay time corresponding to one selector in FIG. 4 is increased by the count up of one time.

When the phase lagging state continues, the count values in the counter circuit 61 count down from the nth count value to the first count value every time the phase lag is detected. If the nth count value counts down by one, next, the (n−1)th count value counts down by one, and then the (n−2)th count value counts down by one. Such count down operation continues as long as the phase comparison result is at the low level state, and if the first count value counts down by one and the phase comparison result is still at low level, the operation is repeated again from the state that the nth count value counts down by one. Each count value counts down so that the selectors in FIG. 4 become invalid in sequence from the selector 91 to the selector 9m by the count down of one time. Thereby the delay time corresponding to one selector in FIG. 4 is decreased by the count down of one time.

Latches 72 to 7n are timing adjusting circuits to make the supply timing of the delay control value to the delay circuit synchronize with the delay clock from the delay circuit in the preceding stage. By these latches, each delay circuit in FIG. 3 delays the delay clock from the preceding stage by a delay time corresponding to the delay control value. At the final state, the phase of the basic clock K0 becomes the same as that of the delay clock Kn, and as shown in FIG. 7, the delay clocks K1 to Kn each delayed by T/n time from the basic clock are formed during the basic clock period T.

As above described, in the delay clock generator of the present invention, the phase comparator 21 compares the phase of the delay clock Kn from the nth delay circuit with that of the basic clock K0, and based on the phase comparison result, the delay control circuit 31 generates the delay control value to make the phase of the delay clock Kn synchronize with that of the basic clock K0 and sets the delay amount of each delay circuit, thereby influence of the disturbance can be suppressed and the delay circuit always giving definite delay to the basic clock is realized. Also the delay control value is expressed by a digital value determining the delay amount of each delay circuit, and all circuits can be constituted by only digital circuits.

Figure 10:
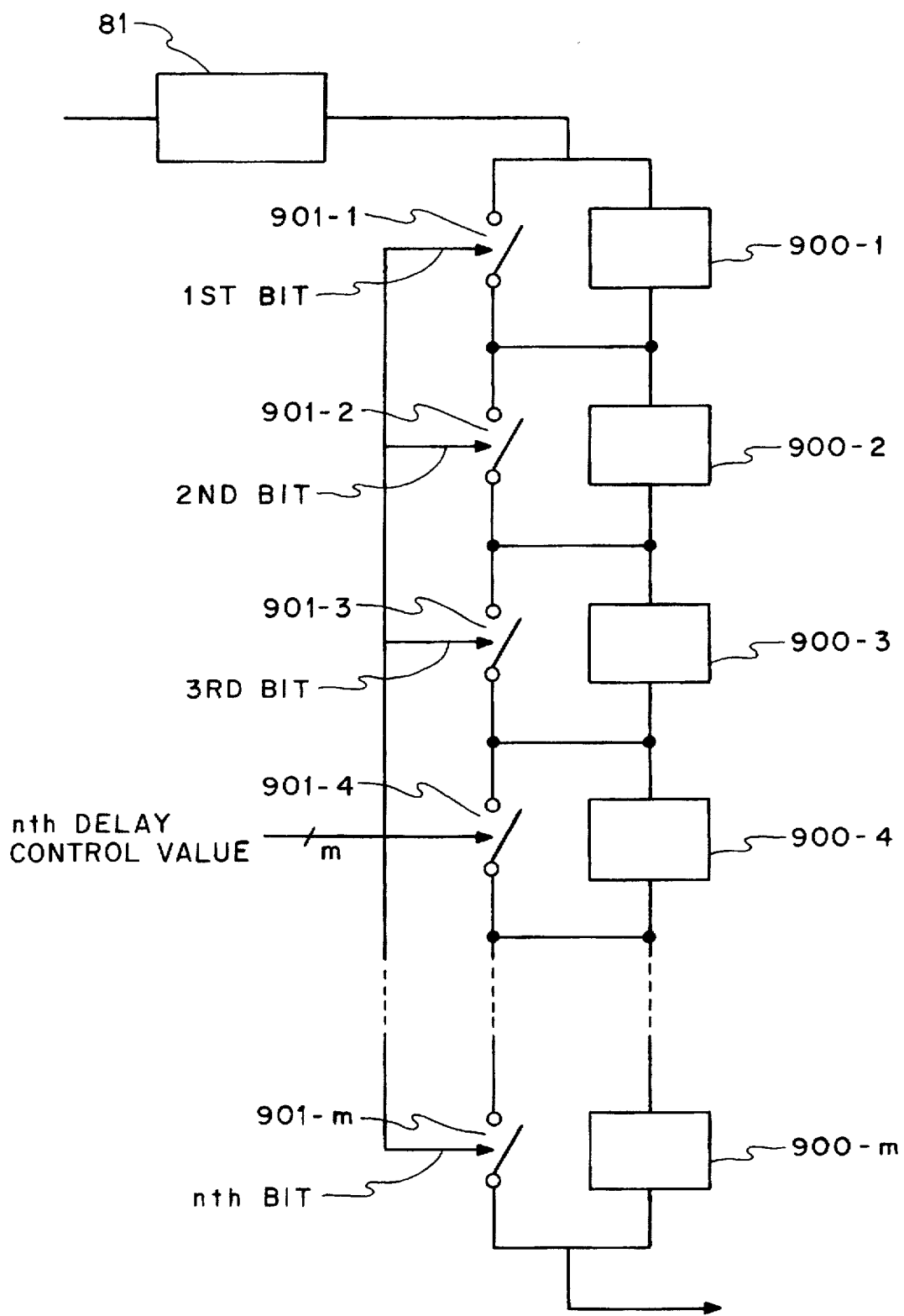
FIG. 10 is a detailed circuit diagram showing another example of a delay circuit of the delay clock generator in FIG. 3.

The present invention is not limited to the above-mentioned embodiment, but various modifications may be made without departing from the spirit and the scope of the invention as hereinafter claimed. For example, in the nth delay circuit in FIG. 4, although the selectors are used as delay elements, as shown in FIG. 10, in place of the selectors 90 to 9m, digital delay elements 900-1 to 900-m such as AND, OR gates and switches 901-1 to 901-m may be used. The delay time of the digital delay element is the same as that of the selector in FIG. 4. The switches 901-1 to 901-m short-circuit the digital delay elements 900-1 to 900-m individually, and the nth delay control value from the delay control circuit 31 is supplied as a switching control signal to each of the switches 901-1 to 901-m per one bit. When the delay control value is "1", the switches 901-1 to 901-m are opened and the digital delay elements become valid. Also when the delay control value is "0", the switches 901-1 to 901-m are closed and the digital delay elements become invalid. Consequently, the series connection number of the digital delay elements 900-1 to 900-m, i.e., the delay amount is determined by the delay control value.

What is claimed is:

1. A delay clock generator said delay control circuit comprising:

first to nth (n: integer not less than 2) delay circuits connected in cascade connection for delaying a basic clock signal in a sequence, said first to nth delay circuits being variable delay circuits for varying a delay time;

a phase comparator for comparing a phase of a delay clock signal from the nth delay circuit with a phase of the basic clock signal in each period of the basic clock signal, and for generating a phase comparison result signal indicating whether the phase of the delay clock from said nth delay circuit leads or lags from the phase of the basic clock; and a delay control circuit for generating a delay control value to make the phase of the delay clock signal from the nth delay circuit synchronized with the phase of the basic clock signal based on the phase comparison result, and for controlling the first to nth delay circuit in sequence by the delay control value to increase or decrease delay amounts of said first to nth delay circuits in response to whether the phase comparison result indicates that the phase of the delay clock signal form the nth delay circuit leads or lags the phase of the basic clock signal, wherein said delay control circuit comprises:

a counter circuit for executing an up count of the basic clock signal when the phase comparison result from said phase comparator indicates the phase leading state of the delay clock signal from said nth delay circuit, for executing a down count of the basic clock signal when the phase comparison result from said phase comparator indicates the phase lagging state of the delay clock signal from said nth delay circuit, and for generating first to nth count values which represent the delay amounts in said first to nth delay circuits and are supplied to said first to nth delay circuits; and a timing adjusting circuit for supplying first to nth count values as the delay control values to said first to nth delay circuits in matching with the delay timing of said first to nth delay circuits.

2. A delay clock generator as set forth in claim 1, wherein said counter circuit counts up the count values in sequence from the first count value to the nth count value every time the phase lead is detected, and if the nth count value counts up and the phase leading state still continues, the operation is repeated again from the state that the first count value counts up.

3. A delay clock generator as set forth in claim 2, wherein said counter circuit counts down the count values in sequence from the nth count value to the first count value every time the phase lag is detected, and if the first count value counts down and the phase lagging state still continues, the operation is repeated again from the state that the nth count value counts down.

* * * * *